(12) United States Patent
Haley et al.

(10) Patent No.: US 10,296,626 B2
(45) Date of Patent: May 21, 2019

(54) GRAPH

(71) Applicant: Autodesk, Inc., San Rafael, CA (US)

(72) Inventors: Michael B. Haley, San Rafael, CA (US); Tara A. Adiseshan, Santa Clara, CA (US); Yoshihito Yotto Koga, Mountain View, CA (US); Senthil Gandhi, San Francisco, CA (US)

(73) Assignee: AUTODESK, INC., San Rafael, CA (US)

( * ) Notice: Subject to any disclaimer, the term of this patent is extended or adjusted under 35 U.S.C. 154(b) by 686 days.

(21) Appl. No.: 14/949,438

(22) Filed: Nov. 23, 2015

(65) Prior Publication Data

US 2016/0147843 A1    May 26, 2016

Related U.S. Application Data

(60) Provisional application No. 62/085,115, filed on Nov. 26, 2014.

(51) Int. Cl.
*G06F 17/30* (2006.01)
*G06F 17/50* (2006.01)
*G06Q 50/00* (2012.01)

(52) U.S. Cl.
CPC .. *G06F 17/30539* (2013.01); *G06F 17/30401* (2013.01); *G06F 17/30525* (2013.01); *G06F 17/30867* (2013.01); *G06F 17/30967* (2013.01); *G06F 17/30979* (2013.01); *G06F 17/50* (2013.01); *G06Q 50/00* (2013.01)

(58) Field of Classification Search
CPC .............. G06F 17/30539; G06F 17/30401
USPC ............................................. 707/722
See application file for complete search history.

(56) References Cited

U.S. PATENT DOCUMENTS

| | | | | |
|---|---|---|---|---|
| 2009/0089270 A1* | 4/2009 | Haley | ............... | G06F 17/3066 |
| 2012/0278321 A1* | 11/2012 | Traub | ............... | G06F 17/30657 |
| | | | | 707/736 |
| 2014/0298200 A1* | 10/2014 | Cierniak | ............ | H04L 65/1069 |
| | | | | 715/753 |
| 2016/0055665 A1* | 2/2016 | Floyd | ................ | G09G 5/02 |
| | | | | 345/419 |

* cited by examiner

*Primary Examiner* — Kimberly L Wilson
(74) *Attorney, Agent, or Firm* — Gates & Cooper LLP

(57) ABSTRACT

A method, apparatus, system, and computer program product provide the ability to define an attribute of a design part in a manufacturing or construction project. Apart set of two or more design parts is obtained. Each of the two or more design parts includes metadata. An external corpus is mined to determine a text set of terms relevant to the metadata. The metadata is mined for a pattern based on the text set to discover a metadata property. An attribute is defined based on the metadata property. A graphical user interface is used to search for design parts utilizing a filter based on the metadata property.

28 Claims, 20 Drawing Sheets

GRAPH

CROSS-REFERENCE TO RELATED APPLICATIONS

This application claims the benefit under 35 U.S.C. Section 119(e) of the following commonly-assigned U.S. provisional patent application(s), which is/are incorporated by reference herein:

Provisional Application Ser. No. 62/085,115, filed on Nov. 26, 2014, by Michael B. Haley and Tara A. Adiseshan, entitled "Design Graph".

BACKGROUND OF THE INVENTION

1. Field of the Invention

The present invention relates generally to data content organization and viewing, and in particular, to a method, apparatus, system, and article of manufacture for generating a graph that represents relationships between data content elements and utilizing such a graph to enable interactive user interfaces.

2. Description of the Related Art

When designing a project (e.g., architectural project, a solid model, an assembly, an interior design, etc.), the designer utilizes or may select from amongst a large (e.g., millions) number of parts. Such parts may be acquired through acquisition (e.g., in manufacturing, an entity may acquire parts or the entirety of another company that is also producing parts), may be developed internally, and/or may be provided by a multitude of persons/entities serving in a variety of roles (e.g., third parties, customers, collaborators, developers, independent contractors, etc.). The parts may be scattered through throughout different storage systems and are not consistently named, resulting in difficulty (if not an impossibility) in finding/locating a particular part. Accordingly, designers may often recreate a part resulting in multiple duplicate parts across an organization. Further, multiple electronic representations of the same part may be designed with subtle differences that are not realized/accounted for until producing the physical part based on such designs (e.g., on a factory floor).

In view of the above, it is desirable to provide a method and system directed towards a part design structure and user interface that enables users to organize, view, and locate a design part across multiple different products/platforms (e.g., desktop, cloud, and mobile applications).

SUMMARY OF THE INVENTION

Embodiments of the invention provide a "Design Graph" consisting of a new core platform technology that may be utilized in many applications (e.g., desktop, cloud and mobile). The design graph may not exist in an independent product buy may be an integrated part of both existing and new products (e.g., available from AUTODESK, INC., the assignee of the present application).

The core principle in the design graph is to mine all customer-generated (design) content in an anonymous and automated way. From this mining, a "graph" is generated that is somewhat analogous to the social or web graphs of FACEBOOK™ or GOOGLE™. In embodiments of the invention, the graph represents all of the relationships between designs, parts (that are in those designs), components of the same type, components that are commonly used-together, etc. The graph is then used to enable searches for parts/objects based on properties that were not manually predefined.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
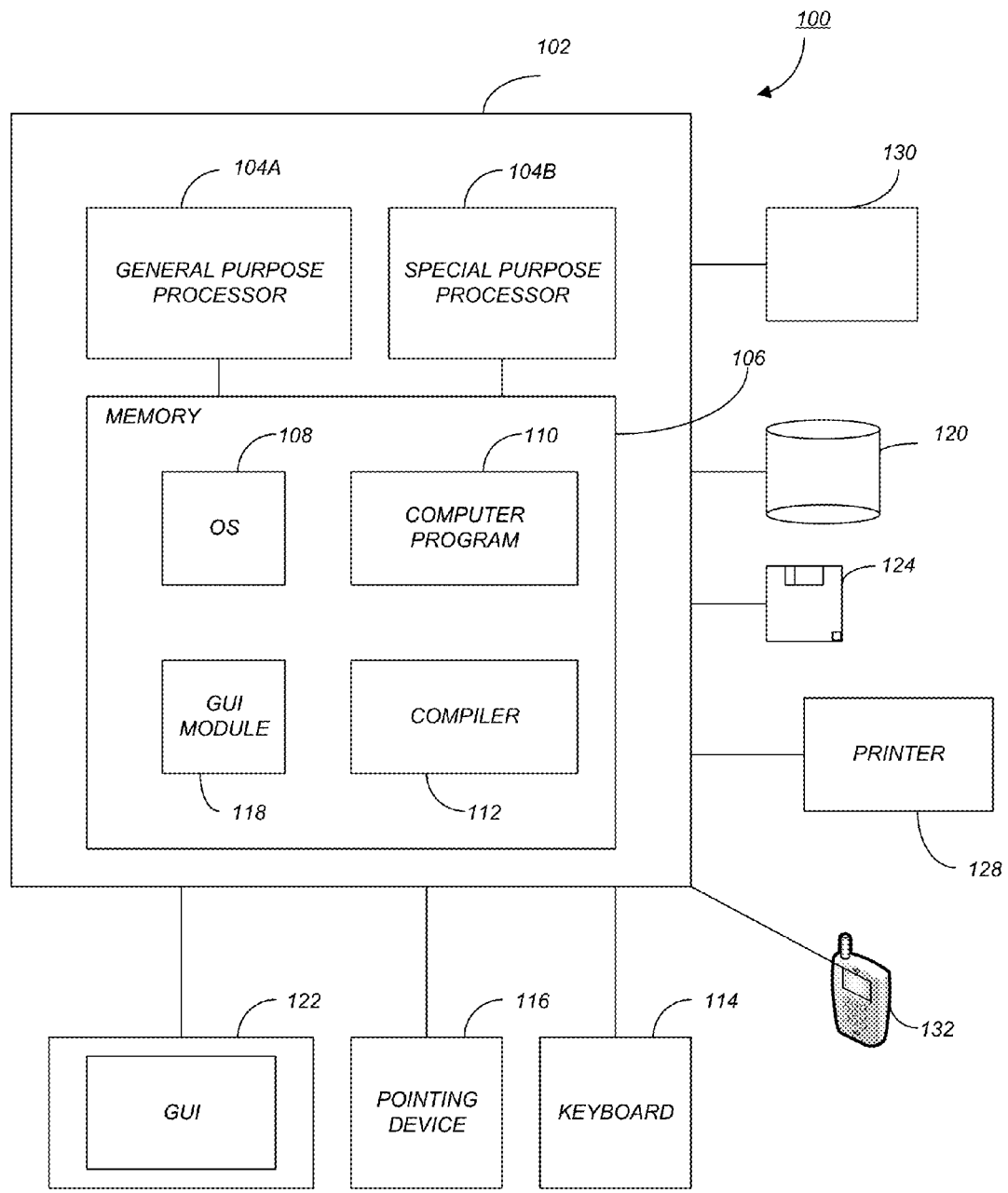
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to, and/or integrated with, other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, IPOD™, NOOK™, portable digital video player, cellular device, personal digital assistant, etc.). In yet another embodiment, the computer 102 may comprise a multi-touch device, mobile phone, gaming system, internet enabled television, television set top box, or other internet enabled device executing on various platforms and operating systems.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118. Although the GUI module 118 is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., IPHONE™, NEXUS S™, DROID™ devices, etc.), tablet computers (e.g., IPAD™, HP TOUCHPAD™), portable/handheld game/music/video player/console devices (e.g., IPOD TOUCH™, MP3 players, NINTENDO 3DS™ PLAYSTATION PORTABLE™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program 110 instructions. In one embodiment, the special purpose processor 104B is an application specific integrated circuit (ASIC).

The computer 102 may also implement a compiler 112 that allows an application or computer program 110 written in a programming language such as COBOL, PASCAL, C++, FORTRAN, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as JAVA™, PERL™, BASIC™, etc. After completion, the application or computer program 110 accesses and manipulates data accepted from I/O devices and stored in the memory 106 of the computer 102 using the relationships and logic that were generated using the compiler 112.

The computer 102 also optionally comprises an external communication device such as a modem, satellite link, Ethernet card, or other device for accepting input from, and providing output to, other computers 102.

In one embodiment, instructions implementing the operating system 108, the computer program 110, and the compiler 112 are tangibly embodied in a non-transitory computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program 110 instructions which, when accessed, read and executed by the computer 102, cause the computer 102 to perform the steps necessary to implement and/or use the present invention or to load the program of instructions into a memory 106, thus creating a special purpose data structure causing the computer 102 to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Figure 2:
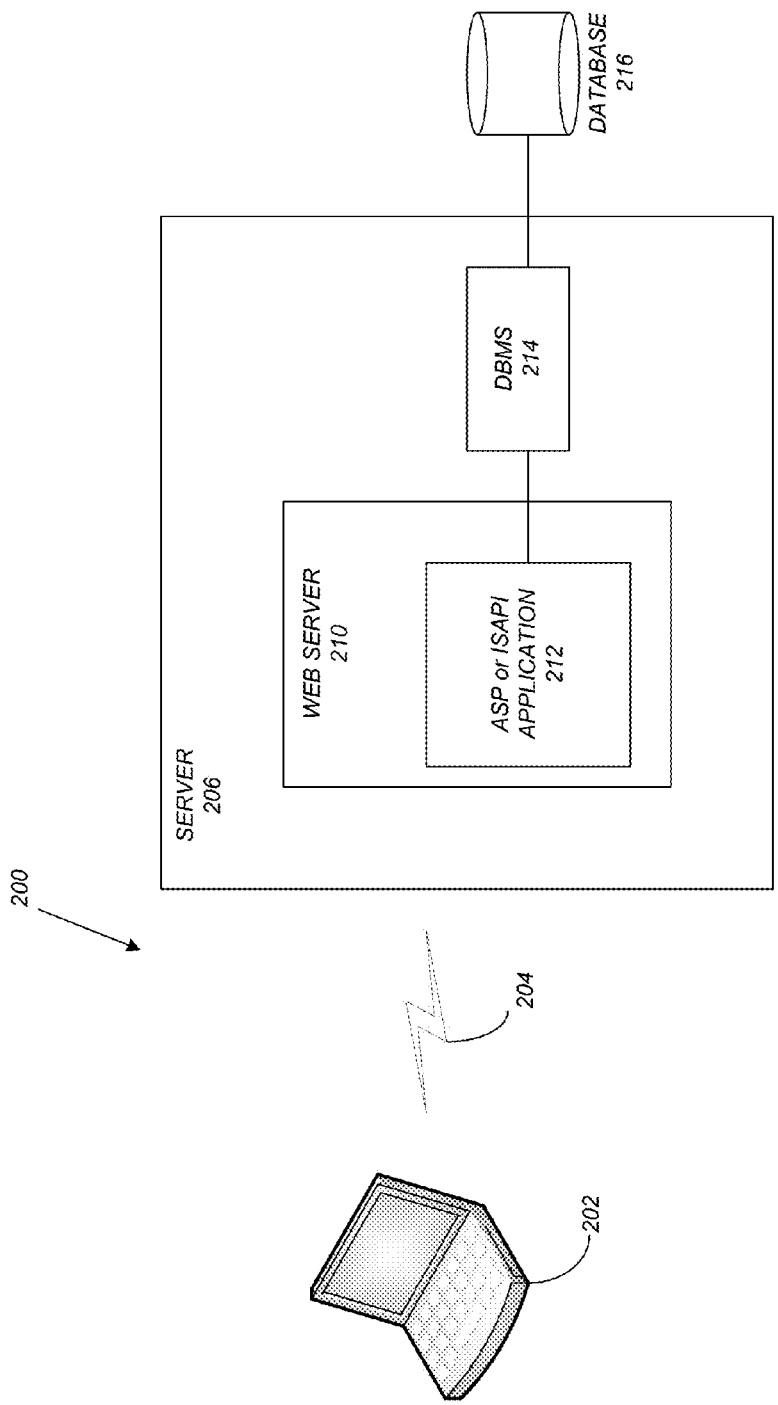
FIG. 2 schematically illustrates a typical distributed computer system using a network to connect client computers to server computers in accordance with one or more embodiments of the invention.

FIG. 2 schematically illustrates a typical distributed/cloud-based computer system 200 using a network 204 to connect client computers 202 to server computers 206. A typical combination of resources may include a network 204 comprising the Internet, LANs (local area networks), WANs (wide area networks), SNA (systems network architecture) networks, or the like, clients 202 that are personal computers or workstations (as set forth in FIG. 1), and servers 206 that are personal computers, workstations, minicomputers, or mainframes (as set forth in FIG. 1). However, it may be noted that different networks such as a cellular network (e.g., GSM [global system for mobile communications] or otherwise), a satellite based network, or any other type of network may be used to connect clients 202 and servers 206 in accordance with embodiments of the invention.

A network 204 such as the Internet connects clients 202 to server computers 206. Network 204 may utilize ethernet, coaxial cable, wireless communications, radio frequency (RF), etc. to connect and provide the communication between clients 202 and servers 206. Further, in a cloud-based computing system, resources (e.g., storage, processors, applications, memory, infrastructure, etc.) in clients 202 and server computers 206 may be shared by clients 202, server computers 206, and users across one or more networks. Resources may be shared by multiple users and can be dynamically reallocated per demand. In this regard, cloud computing may be referred to as a model for enabling access to a shared pool of configurable computing resources.

Clients 202 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, GOOGLE CHROME™, etc. Further, the software executing on clients 202 may be downloaded from server computer 206 to client computers 202 and installed as a plug-in or ACTIVEX™ control of a web browser. Accordingly, clients 202 may utilize ACTIVEX™ components/component object model (COM) or distributed COM (DCOM) components to provide a user interface on a display of client 202. The web server 210 is typically a program such as MICROSOFT'S INTERNET INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 202 instead of communicating/obtaining the information from database 216 across network 204. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 202 and 206 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 202 and 206.

Embodiments of the invention are implemented as a software application on a client 202 or server computer 206. Further, as described above, the client 202 or server computer 206 may comprise a thin client device or a portable device that has a multi-touch-based display.

Organizational Structure/Design

The core principle in the design graph is to mine all customer-generated (design) content in an anonymous and automated way. From this mining, a "graph" can be generated that is somewhat analogous to the social or web graphs of FACEBOOK™ or GOOGLE™. In embodiments of the invention, the graph represents all the relationships between designs, parts (that are in those designs), components of the same type, components that are commonly used-together, etc.

Once this data is made available (as a service) to various applications, sophisticated user interfaces can be provided for customers to navigate and explore their information. In embodiments of the invention, a single entity may host a customer's (and/or third party) data in a cloud based system. Accordingly, the organizational structure and interface to such data may be provided by such a single entity and/or may be provided by multiple entities (e.g., via Application Programming Interfaces [APIs] that may also host such data).

Figure 3:
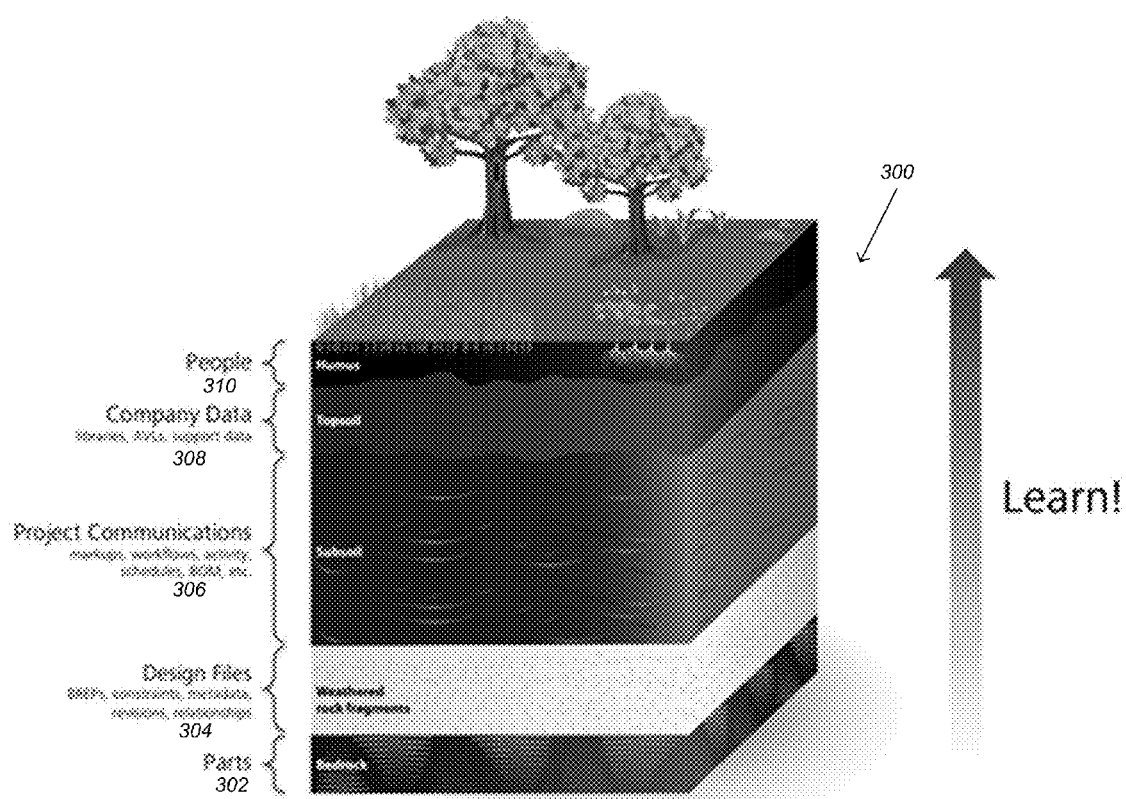
FIG. 3 illustrates a core concept of the data organization in accordance with one or more embodiments of the invention.

FIG. 3 illustrates a core concept of the data organization in accordance with one or more embodiments of the invention. An analogy to terrain is illustrated in FIG. 3. The bottom level of bedrock represents the base level of parts. Above the bedrock are weathered rock fragments that represent design files such as BREPs (boundary representations), constraints, metadata, revisions, relationships, etc. The next layer of subsoil represents project communications such as markups, workflows, activity, schedules, BOM (bill of materials), etc. The topsoil layer corresponds to company data such as libraries, AVLs (Georgy Adelson-Velsky and Evgenii Landis tree—a self-balancing binary search tree), and support data. The uppermost layer of Humus (e.g., decomposed organic matter) corresponds to people.

Bottom-Up Design Analysis and Determination

Referring to FIG. 3, unlike other attempts at machine learning in this environment, that begin with trying to profile people and then deduce useful insights, embodiments of the invention begin at the bottom and go upwards. Parts 302 (or the individual graphical objects that make up all designs) are the "lowest common denominator" of all designs. The parts 302 are always there (otherwise you don't have a design) and there are very useful correlations in the nature (primarily shape) between designs generated by different people, organizations and disciplines. Specifically the shapes of the fundamental components correlate strongly into clusters of common real-world components (e.g. nuts, bolts, plates, motors, chains, etc.) of various types. Given that typical designs consist of many of these component, these clusters can be used to produce a "signature" of the design itself whereby the design is automatically classified based on the nature of components occurring within it.

Once embodiments of the invention have learned to classify and represent the geometric shapes and usage patterns of parts 302, useful insights (and classifications) of the designs 304 can be deduced that make use of them. Once these design insights 304 are acquired, the same type of analysis may be performed with the surrounding project communications 306. This process continues from bottom up, to derive company data 308, and the top most layer "People" 310 such that very accurate insights into a person's: role, industry, etc. have been derived. However, in this case, these insights are based on the actual work these people 310 have produced amplified (and corrected) by an understanding of the work done by every other person.

In other words, embodiments of the invention begin the process with the primitive component elements of a design (e.g., the 3D geometry and metadata for parts 302). Machine learning is utilized to recognize different types of parts 302 and to distinguish parts (e.g., nuts, bolts, bushings, stair cases, railings, etc.). The initial analysis may be based purely on the geometry of the part components 302 (and some metadata tagged onto such components). Once the initial analysis of the parts 302 has been conducted, the result may provide a useful tool to a user. For example, a user may be point to a particular part and query for similar parts. In response, a useful result would be available.

Once the initial analysis permits parts 302 to be distinguished, one may derive information at the design file level 304. For example, if stairs and railings have been identified in the part layer 302, one may derive that the design is for a building that is a multi-floor building at the design file level 304. Accordingly, embodiments of the invention may differentiate different designs (e.g., hospitals from hotels, motorbikes from bicycles), etc. This learning process continues up the stack 300 until information about individual people 310 can be derived. Accordingly, the learning process helps people 302 understand their data from the bottom-up.

Design Graph Data Structure

The Design Graph is a unique intelligent data structure that is used to represent design content in many different design products/applications. The Design Graph fully computes (from Parts to Designs to Projects to People), via machine learning, various representations of the design content based on a base level component/part (e.g., geometry) of a design element. The nodes of the Design Graph provide intelligent learned information based on information contained within children nodes.

The Design Graph offers rich connectivity between the designs and projects that every person is working on, allowing users to associate rich data with the nodes of the graph. This could include information such as cost, materials, scheduling, and prior performance. For example, by associating cost information, it could be possible to answer a question such as: "I have designed a mountain bike. Please estimate the cost of producing this mountain bike and tell me how it compares to the typical cost of mountain bikes designed by others."

The nodes of the Design Graph represent both the original data from which the Design Graph learned its insights as well as a number of learned objects. Specifically for designs (which embody a number of parts) these nodes are defined:
  Design—the original design itself;
  Canonical Design—identifies all duplicates of this same type of design; and
  Design Class—identifies a category of designs based on the patterns of components within them.

These design nodes are then cross linked to each other within the graph to support sophisticated query semantics.

Specifically for parts (both within a design and standalone files) these nodes are defined:
  Part—the original part itself (If this is part of a design then these nodes are linked to the respective Design nodes.);
  Canonical Part—identifies all duplicates of this same type of part; and
  Part Class—identifies a category of parts based on the shape and metadata characteristics of the parts.

These parts nodes are then cross linked to each other within the graph to support sophisticated query semantics.

User Interfaces to the Design Graph

Because exploration of design information through such a graph is unique, there are few precedents from a user experience perspective. Therefore, embodiments of the invention provide several different experiences. Each user experience emphasizes a different aspect of the design graph and supports different exploration scenarios.

In each case below the user context is someone who is:
  Looking for a design or design idea;
  Looking to be inspired;
  Doesn't really know how to accurately specific what they are looking for;
  Looking for components/parts to use in a design;
  Looking for starting points (design data that can be reused and evolved);

Part/Design User Interface

Figure 4A:
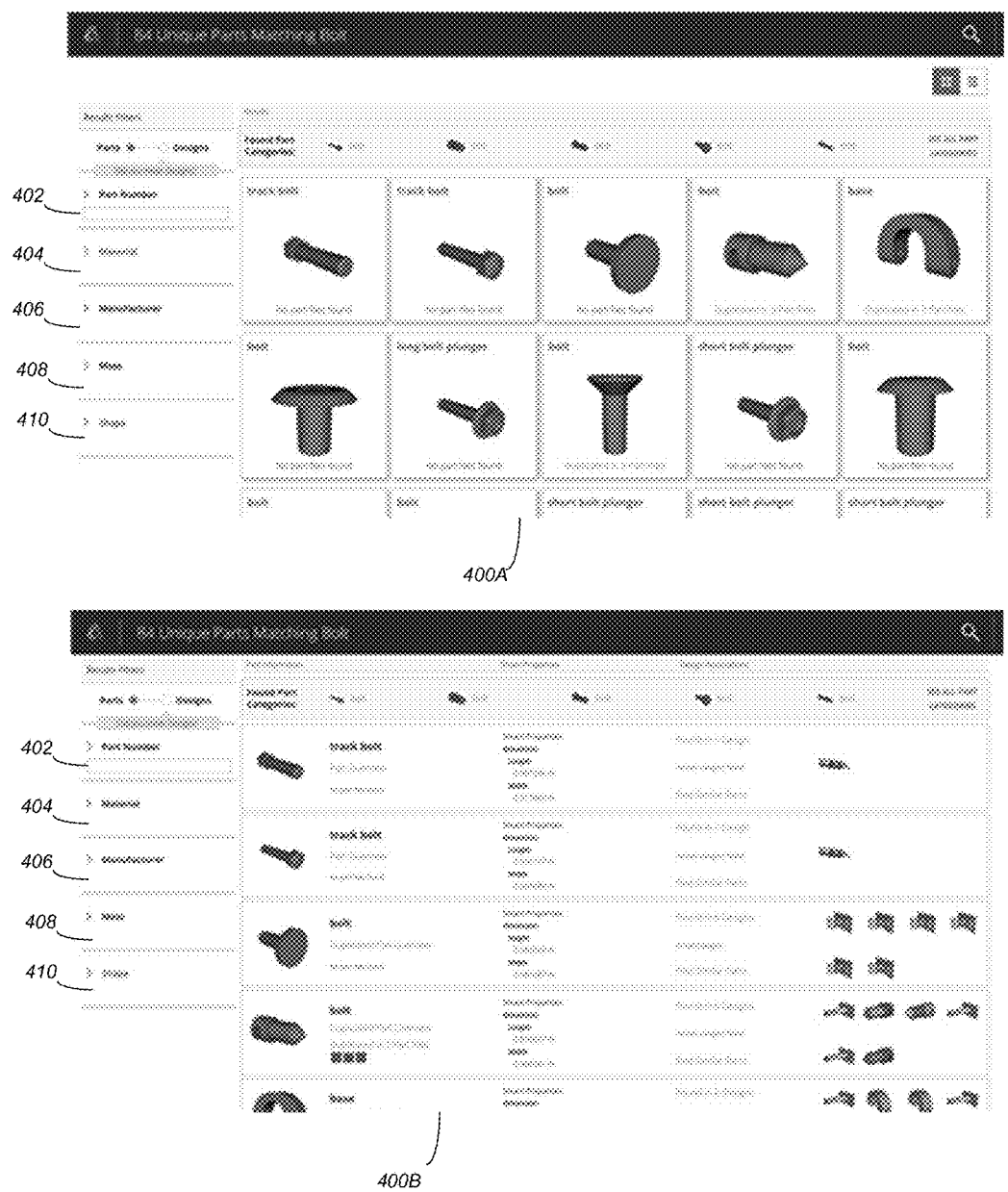
FIGS. 4A, 4B, and 4C illustrate three fundamental states of a user interface in accordance with one or more embodiments of the invention.
Figure 4B:
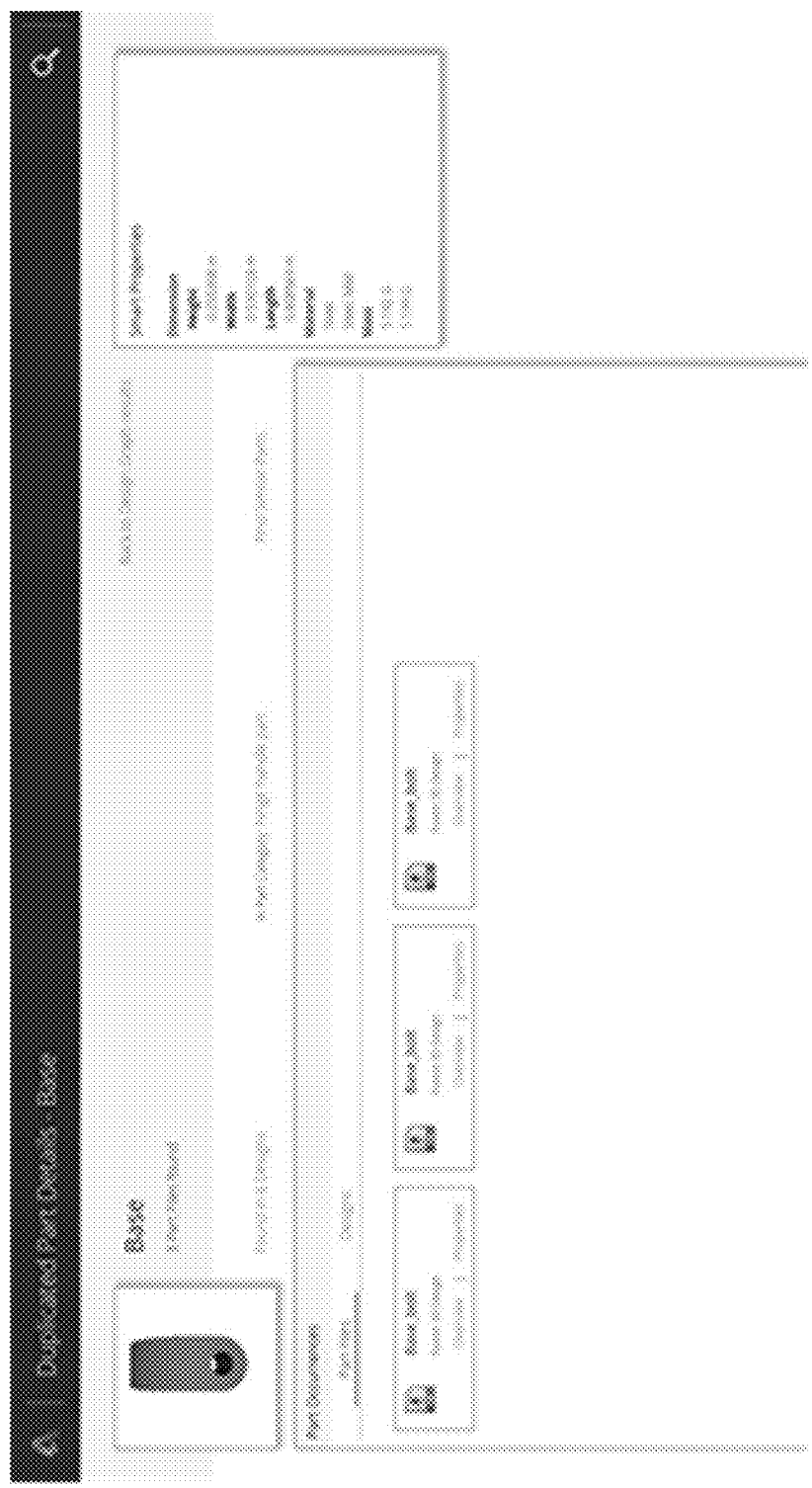
Figure 4C:
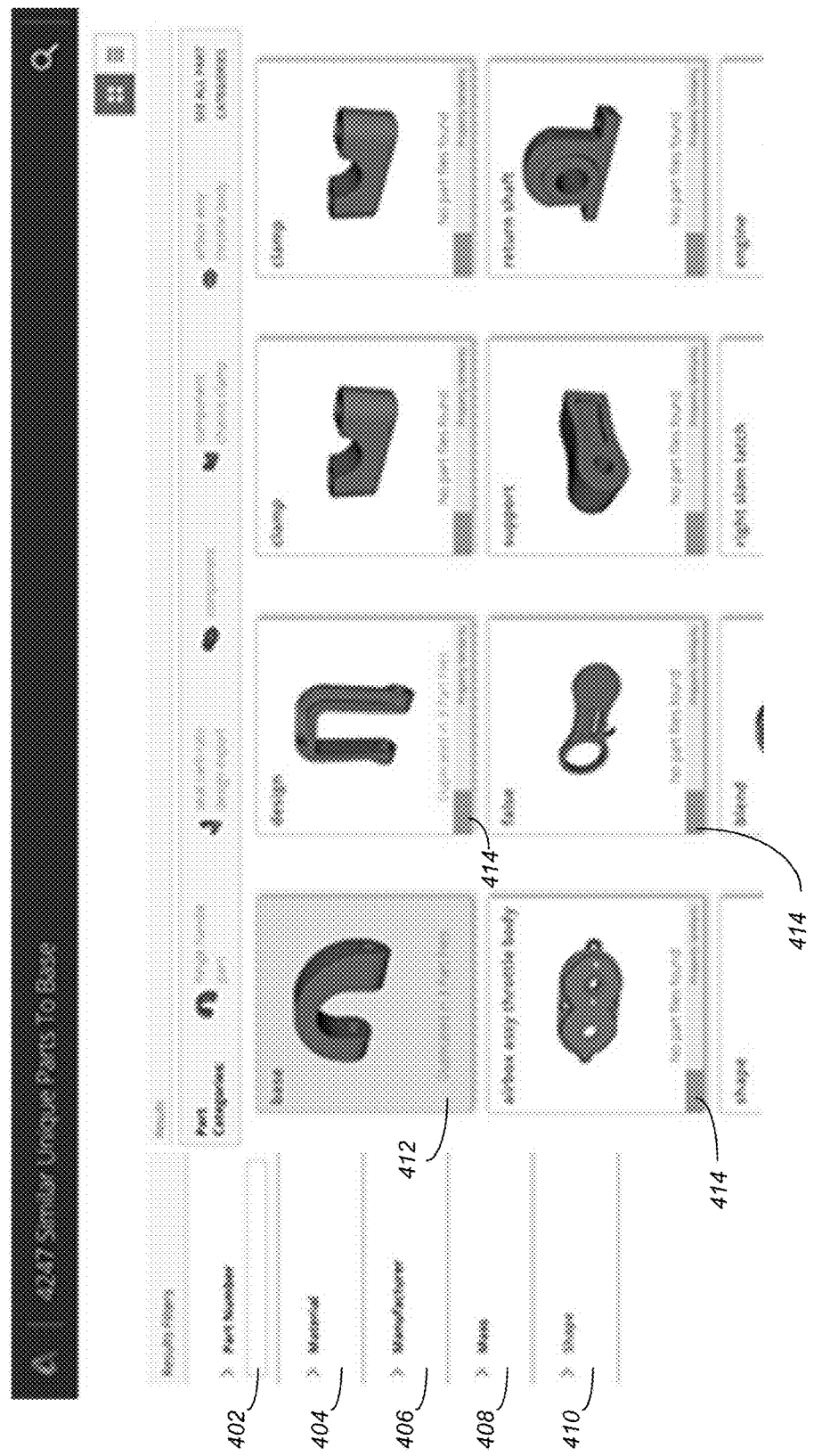

A part/design user interface enables a user to search for parts/designs, view details for a found part/design (including duplicates), and finding similar parts/designs. The part/design user interface has three fundamental states: Searching, Duplicated Part Details, and Similarity as illustrated in FIGS. 4A, 4B, and 4C respectively.

In the searching state (FIG. 4A), the user interface 400 (illustrated in a table view 400A and list view 400B, collectively referred to as user interface 400) enables the finding of designs/parts through names and machine learned categories. The user can enter the desired search attribute into the desired field 402-410 (e.g., part number 402, material 404, manufacturer 406, mass 408, shape 410, etc.). The result user interface 400 page displays distinct parts (i.e., it does not display exact duplicates). Accordingly, the user interface 400 already helps a user avoid data overload from many duplicate parts.

In the Duplicated Part Details state (FIG. 4B), once a part or design is selected, this user interface displays related information as well as details about the selected part/design. Further, this user interface page allows a user to uncover the various files representing a part be they part file or design files where the part is used. In other words, the user can select a particular part in FIG. 4A, and in FIG. 4B, a view of the duplicated parts (for the selected part) may be viewed.

In the Similarity state (FIG. 4C), from the details state, it is possible to explore similar parts/designs. These similar parts/designs can then be filtered by category or by smart properties. Additionally, the similarity state user interface shows (e.g., in a visually distinguishable manner such as a green bar), what the similarity in metadata/properties is between a part and the original search part (e.g., that may be displayed in a different visually distinguishable manner [e.g., highlighted in blue]). In FIG. 4C, the originally searched part 412 is highlighted and the features/attributes of part 412 that is similar to the other parts displayed are indicated via a common feature bar 414.

A unique feature of the user-interfaces of FIGS. 4A-4C includes the smart filter/smart properties functionality. As described above, in almost all data management systems, in every industry, customers struggle with standardization and consistency in the metadata of designs and components. Specifically, this means that the various files that constitute designs support a variety of custom fields that can be used to locate those files. Typically, these can be used to find by:

Part Number 402;
Materials used 404;
Who interacted with or approved of a design;
What project something was part of;
The cost of a component;
Etc.

Because these fields are not predefined, every customer, and sometimes every engineer accessing the files completes (and names) these fields differently giving them different names. For example, one engineer might call the field for approval, "Approved By" whereas another might call is "Ap_by". Once such differences proliferate over several years, and once external content is brought into a company, it is extremely difficult to correct. Customers generally resort to labor intensive manual efforts at this point.

Some PLM (produce lifecycle management) products (e.g., the AUTODESK VAULT™ product) may offer facilities to "alias" (or dynamically rename) known field names to others. Such facilities may be useful but is still manual and requires customers to crawl through millions of part files and models to determine which fields should be aliased and then setting up those aliases.

Embodiments of the invention apply machine learning to this problem in order to take the manual work away from the customer and make it appear to them as though certain fields are completely consistent (even though they are not actually). In particular, as the design graph machine learning system mines all components, the system looks for specific patterns in the metadata of components relating to: part numbers 402, materials 404, manufacturers 406, mass 408, and dimension/shape 410. Such attributes/fields 402-410 are the most commonly used fields in manufacturing and construction environments.

Figure 5:
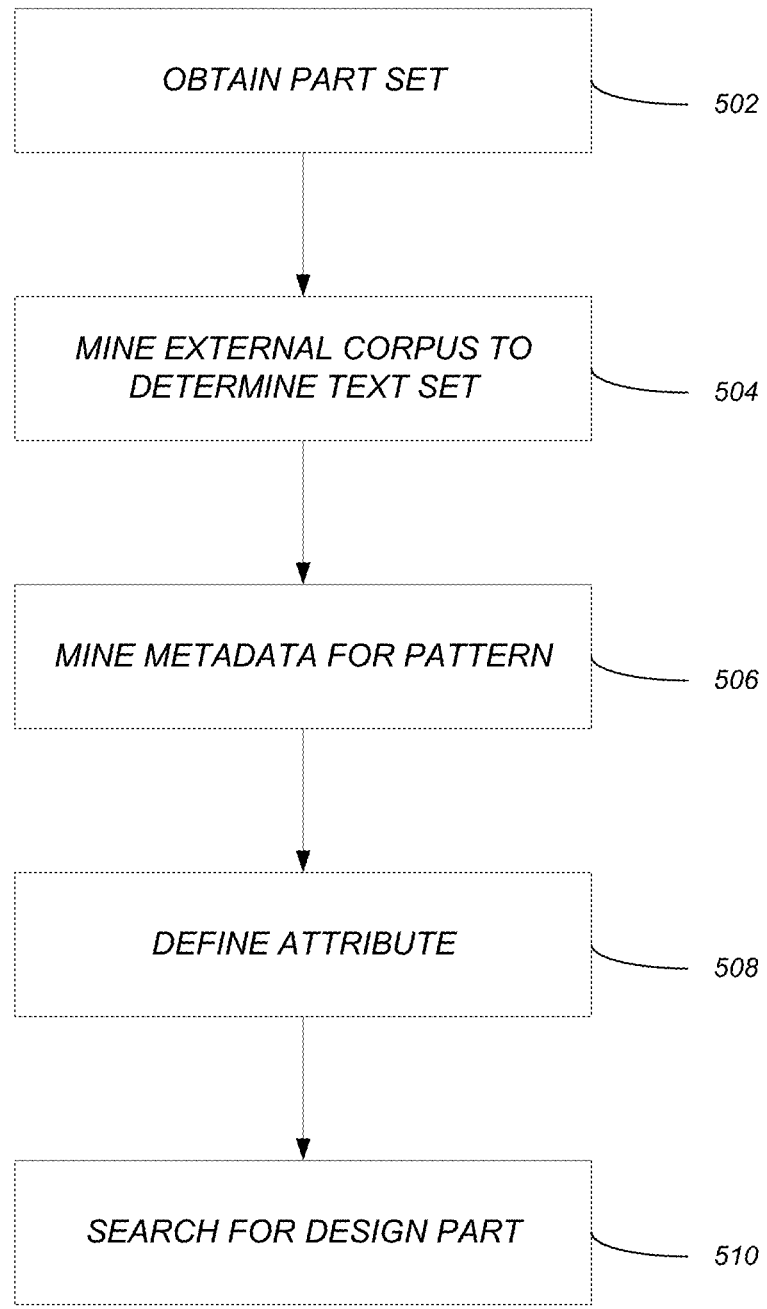
FIG. 5 illustrates the logical flow for defining an attribute of a design part in a manufacturing or construction project in accordance with one or more embodiments of the invention.

FIG. 5 illustrates the logical flow for defining an attribute of a design part in a manufacturing or construction project in accordance with one or more embodiments of the invention.

At step 502, a part set of two or more design parts is obtained. Each of the two or more design parts has metadata.

At step 504, an external corpus is mined (e.g., using a machine learning technique) to determine a text set of terms relevant to the metadata.

At step 506, the metadata is mined for a pattern based on the text set to discover a metadata property.

At step 508, an attribute is defined based on the metadata property.

At step 510, via a graphical user interface, a search for design parts is conducted using a filter based on the metadata property/attribute.

Based on the steps in FIG. 5, the way the patterns are determined for each metadata property may differ. The variances in such methods are described below.

Part Numbers

Figure 6:
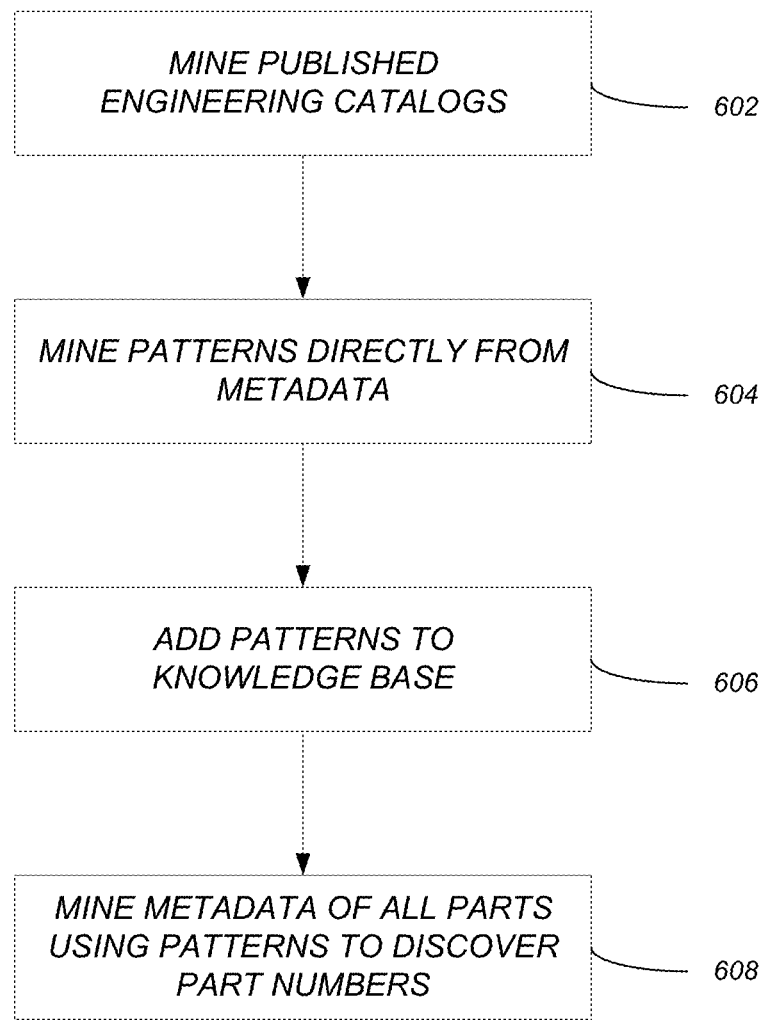
FIG. 6 illustrates the logical flow for determining specific patterns in the part numbers in accordance with one or more embodiments of the invention.

FIG. 6 illustrates the logical flow for determining specific patterns in the part numbers in accordance with one or more embodiments of the invention.

At step 602, to find a patterns relating to the part number, the design graph machine learning system first mines an external corpus of published engineering catalogs to learn the text syntax of common/known part numbering systems such as ISO, ANSI, ASME, DIN, etc. The system performs this task completely automatically using a variety of machine learning techniques such as decision trees and neural networks.

At step 604, the system mines patterns directly from the metadata using well known "part number" fields (that can be relied upon) (to determine additional text syntax).

At step 606, these patterns/additional text syntax are added to a knowledge base of part number syntax (e.g., the text set).

At step 608, all metadata of all parts is mined using the above patterns to discover part numbers anywhere in the metadata of a component.

Materials

Figure 7:
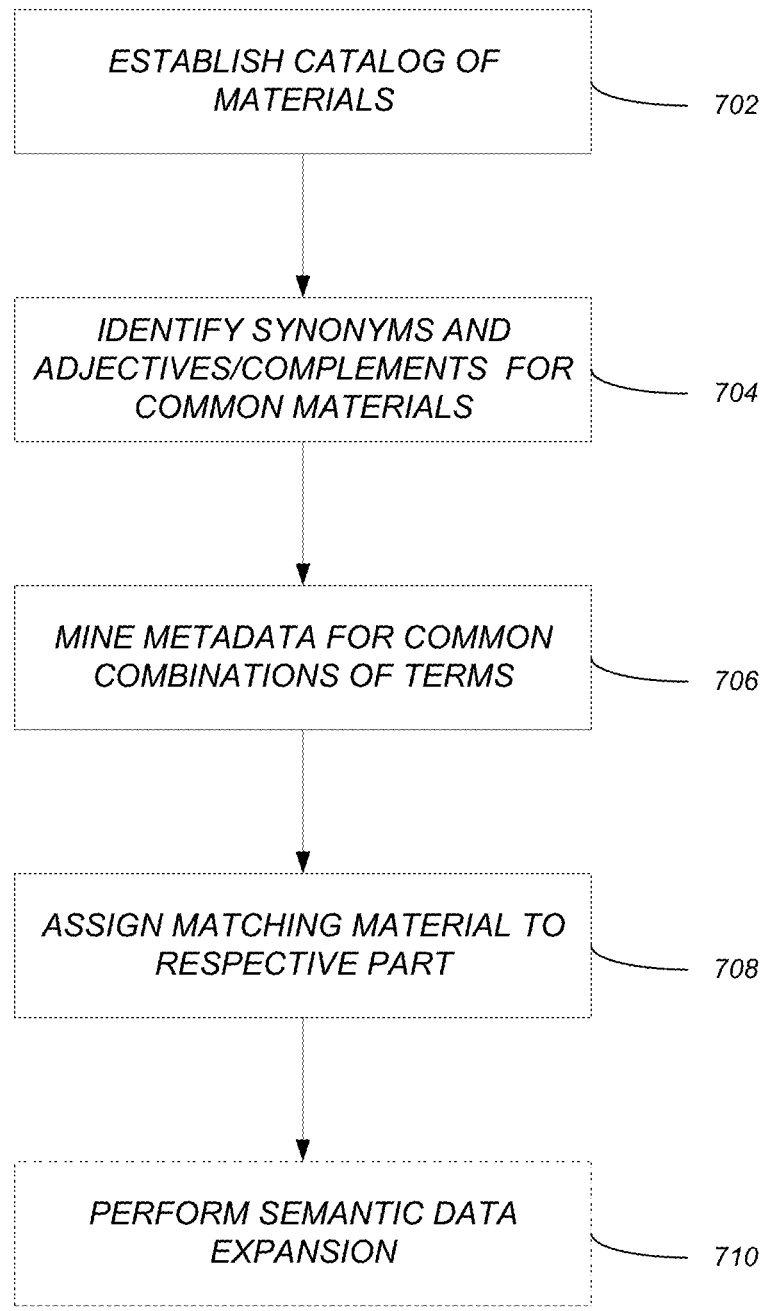
FIG. 7 is a flow chart illustrating the logical flow for determining specific patterns relating to materials in accordance with one or more embodiments of the invention.

FIG. 7 is a flow chart illustrating the logical flow for determining specific patterns relating to materials in accordance with one or more embodiments of the invention.

At step 702, a predefined catalog of materials is established. Such a catalog may be constantly growing and may be established manually or automatically.

At step 704, machine learning is used to target a large set of external text corpuses to locate synonyms for common materials and locate statistically likely adjectives/complements used with specified material terms. This likelihood is determined by examining the frequency by which specific words combine with core material terms and conversely how often they occur independently. If preceding or succeeding words are discovered that have a more significant correlation with the existence of the core material name than they have with other words, then the preceding/succeeding words are chosen as potential adjectives. Special consideration is made for common color names as they have different frequency characteristics due to their breadth of use. In such a case, the words for common color names are directly recognized from a dictionary and included. Accordingly, for every defined material in the catalog, a broader set of terms to search on is identified.

At step 706, all metadata of all parts are mined looking for common combinations of the set of terms (e.g., the specified set of materials terms, synonyms, and adjectives/complements). Specifically, the metadata is mined looking for occurrences of base material names together with (potentially) a set of qualifiers such as adjectives.

At step 708, when there is reasonable confidence of a match (i.e., between the common combination of terms and a material in the catalog), then the associated material from the catalog is assigned to the respective part. A match is considered reasonable if: (a) one of the synonyms of a base material name matches one of the words; or (b) if one of the words matches a base material name within an edit distance of two (2) but more than one known adjective also occurs. In other words, a determination is made (based on the mining/searching at step 706) that metadata from a design part in the part set matches the combination. Based on the match, associated material from the catalog is assigned as the attribute of the matching design part.

At optional step 710, semantic data expansion may performed to enhance the pattern matching of steps 702-708. A learned "clusters" of component type may be used to perform such enhancement. As an example, if a set of one-thousand (1000) things called "hex bolts" are identified and nine-hundred and sixty (960) of them are labeled as being made of metal, and then another forty (40) have nothing on them, then it is highly probably that those other forty (40) are also metal. Such an approach provides a form of semantic data expansion where one form of learning (assigning material names) is enhanced by another (identifying categories of components based on shape).

Manufacturer

Figure 8:
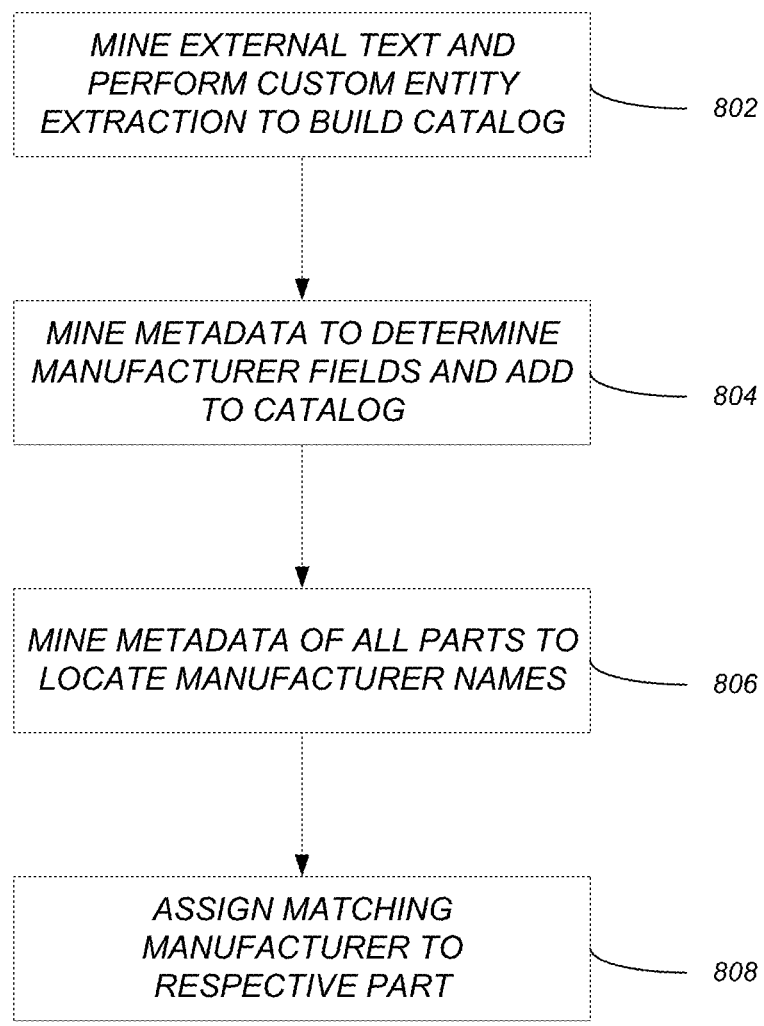
FIG. 8 is a flow chart illustrating the logical flow for determining specific patterns relating to manufacturers in accordance with one or more embodiments of the invention.

FIG. 8 is a flow chart illustrating the logical flow for determining specific patterns relating to manufacturers in accordance with one or more embodiments of the invention.

At step 802, the machine learning mines an external corpus of text (from the web) and performs customized entity extraction to build a catalog of common manufacturer names.

At step 804, all part metadata is mined to find well known "manufacturer" fields and learn those names too (e.g., the names of the manufacturer fields are added to the learned catalog of manufacturer names).

At step 806, all metadata of all parts are mined/searched to locate these manufacturer names (i.e., to find a matching design part).

At step 808, when reliable matches are found in the metadata, the corresponding manufacturer from the learned catalog is assigned to the respective/matching design parts. A reliable match is where the metadata exactly matches one of the discovered manufacturer names from earlier in the process. There is special treatment (given a manually created dictionary) for common manufacturer names that are also very common words (e.g. "Standard").

Mass

Figure 9:
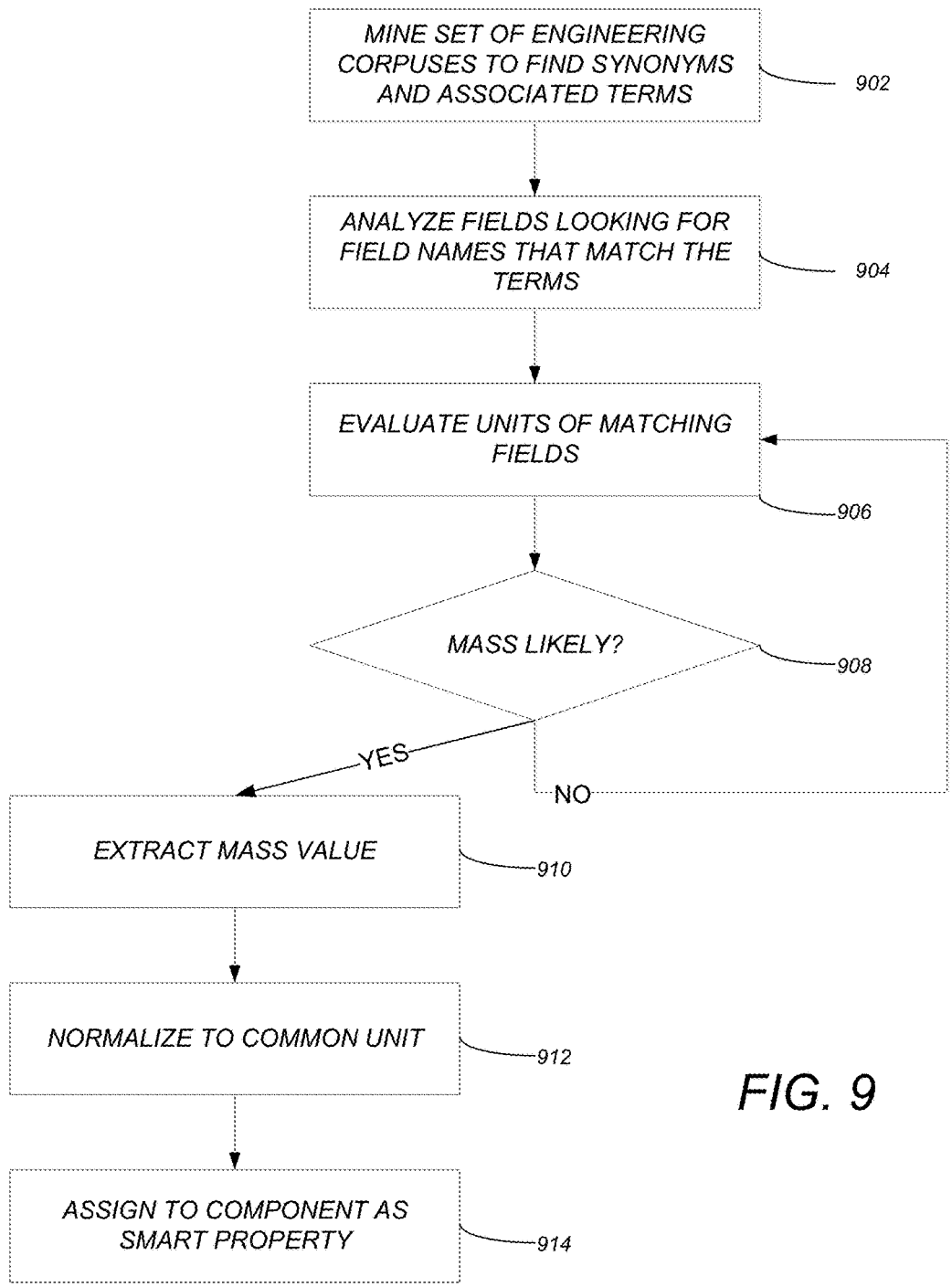
FIG. 9 is a flow chart illustrating the logical flow for determining specific patterns relating to mass in accordance with one or more embodiments of the invention.

FIG. 9 is a flow chart illustrating the logical flow for determining specific patterns relating to mass in accordance with one or more embodiments of the invention.

At step 902, the machine learning mines sets of engineering corpuses to look for synonyms and associated terms for mass or weight.

At step 904, all fields are analyzed/searched looking for field names that match these synonyms and/or terms. These matches are based on exact matches to one of these learned terms.

At step 906, once fields are found, their units are evaluated to determine a likelihood that the units represent mass. In this regard, if no units are found, then it is unlikely that this is a valid mass value that could be used. Thus, only values that include some units (e.g. "kg") would be included. The methodology has a set of unit names and representations within it that are used to match (at a substring level) within the mass values in the metadata. If any of these units names match (at the substring level) then a value is considered a valid mass value.

At step 908, a determination (based on the evaluation at step 906) is made whether mass is likely (as determined by the steps above also combined with some sanity checking of the range). Mass values smaller than single micrograms are not considered as well as mass values in excess of 50,000 kg. If mass is not likely, the process returns to step 906. If mass is likely, the mass values are extracted at step 910, normalized to a common unit at step 912, and the normalized mass value is assigned to the component/design part (corresponding to the matching fields) as a smart property at step 914.

Dimension

Figure 10:
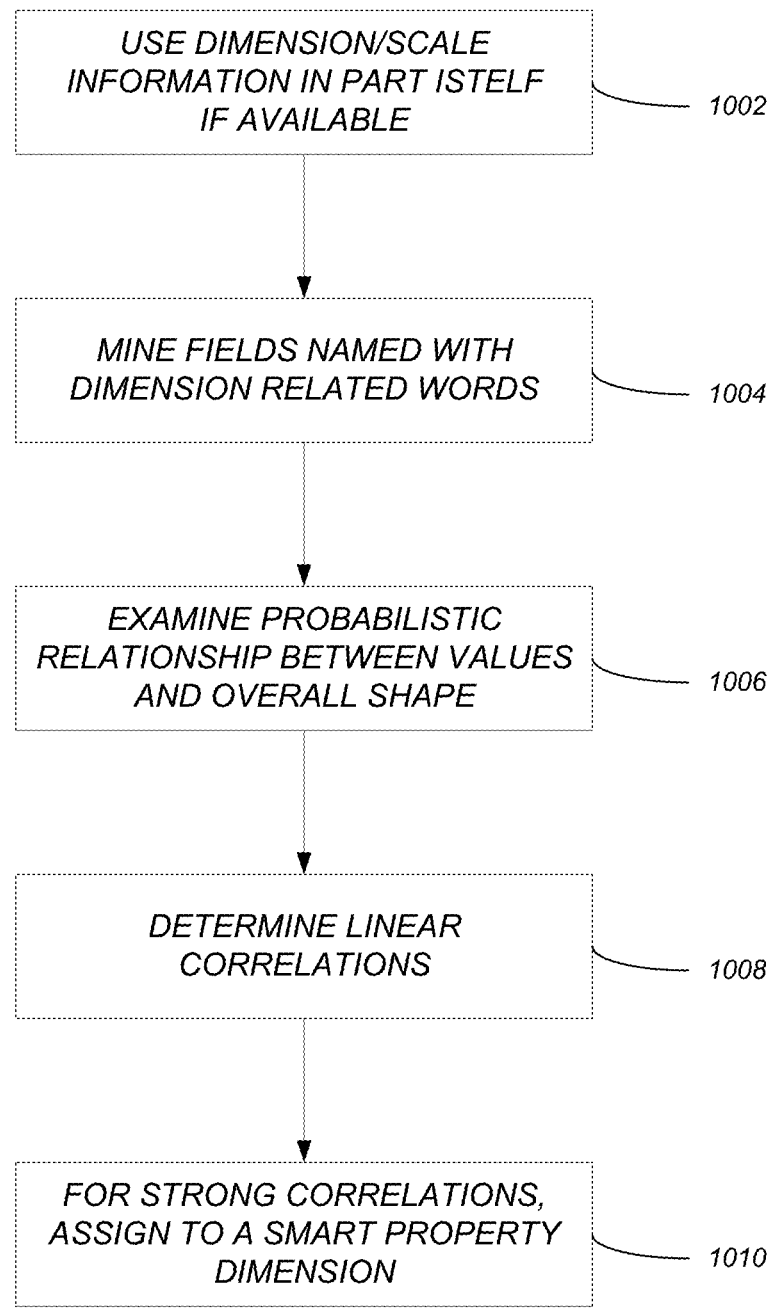
FIG. 10 is a flow chart illustrating the logical flow for determining specific patterns relating to dimension in accordance with one or more embodiments of the invention.

FIG. 10 is a flow chart illustrating the logical flow for determining specific patterns relating to dimension in accordance with one or more embodiments of the invention.

At step 1002, the machine learning system looks for dimension or scale information within the 3D model of each part itself. If there is dimension or scale information assigned to the model, then that is simply used as the part's dimension.

At step 1004, if the dimension/scale is not available (in step 1002), or in addition, the machine learning mines all fields/metadata values that are named with common words expressing standard dimension ("width", "depth", "length", etc.). Accordingly, the text set consists of the list of common words.

At step 1006, once these fields/metadata values are determined, the machine learning system examines the probabilistic relationships between the values and the overall shape (bounding box) of the 3D model for all components within each learned category (based on shape) of components.

At step 1008, based on the analysis at step 1006, linear correlations between the three (3) standard dimensions of the bounding box and these fields/metadata values are determined. For example, suppose a particular cluster has five (5) parts that all have a "length" field with values: 2', 4', 8', 16' and 32'. Further suppose that when examining one of the axial dimensions of the bounding boxes of these five (5) parts, it is found that the axial dimension doubles in each case. Such an observation indicates a strong correlation between the axial dimension and the length field (based on the same variation seen in the axial dimension and the "length" field). In this case, if the size of one axial dimension is within 0.01 error (normalized to 0-1 range) of a linear relationship (ax+b) to a particular metadata value (x) for all occurrences of models of the same category, then that metadata value is considered a valid dimension of the component.

At step 1010, for those metadata properties that have strong correlations, the field/metadata value is assigned to one of three standard (smart property) dimensions: length, width and height.

Smart Property User Interface

Figure 11:
FIG. 11 illustrates a material based search filter used to find a component in accordance with one or more embodiments of the invention.
Figure 12:
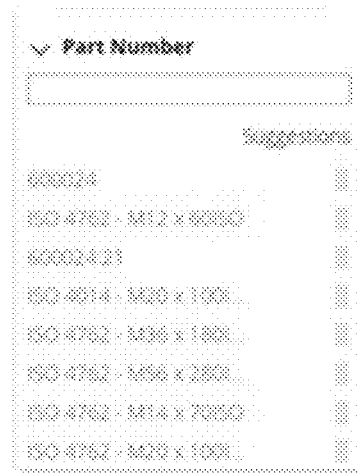
FIG. 12 illustrates the use of a part number based smart filter with part numbers identified in accordance with one or more embodiments of the invention.

All of the above described properties (e.g., part number, material, manufacturer, mass, and dimension) are then surfaced to a user of the design graph software whenever looking at the details of a part, while also being surfaced as standard search filters in the user interface. FIGS. 11 and 12 are exemplary illustrations of how materials and part numbers respectively can be used to find components irrespective of the original metadata on those components in accordance with one or more embodiments of the invention. FIG. 11 illustrates a material based search filter used to find a component. As illustrated, when the user selects material, a subset of available search filters (based on the learned material names as described above) are displayed (e.g., metal with 68 results, and further types of metal including steel (12), steel mild (55), and steel carbon (1)) and may be selected by the user. Similarly, FIG. 12 illustrates the use of a part number based smart filter with part numbers identified via the process described above. As can be seen, different part numbers are listed as suggestions available for selection by the user. The selected filters may then be used to reduce the solution set of components the user is attempting to find/locate/search.

In view of the above, the use of the machine learning system in/to the above-described domain and data is unique. In contrast, traditional, manual, data cleansing methods do not scale and are difficult to enforce. Accordingly, embodiments of the invention utilizes the power of mass data analysis and machine learning to perform "remapping" and "reinterpretation" of the underlying metadata to provide users with the ability to locate components in a consistent way without worrying about data quality.

Multi-Dimension Explorer User Interface

With a multi-dimension explorer user interface, the objective is to give the user a single screen (i.e. not like a traditional multi-screen web-page) where the user can navigate through all of the data and linkages very quickly.

Figure 13:
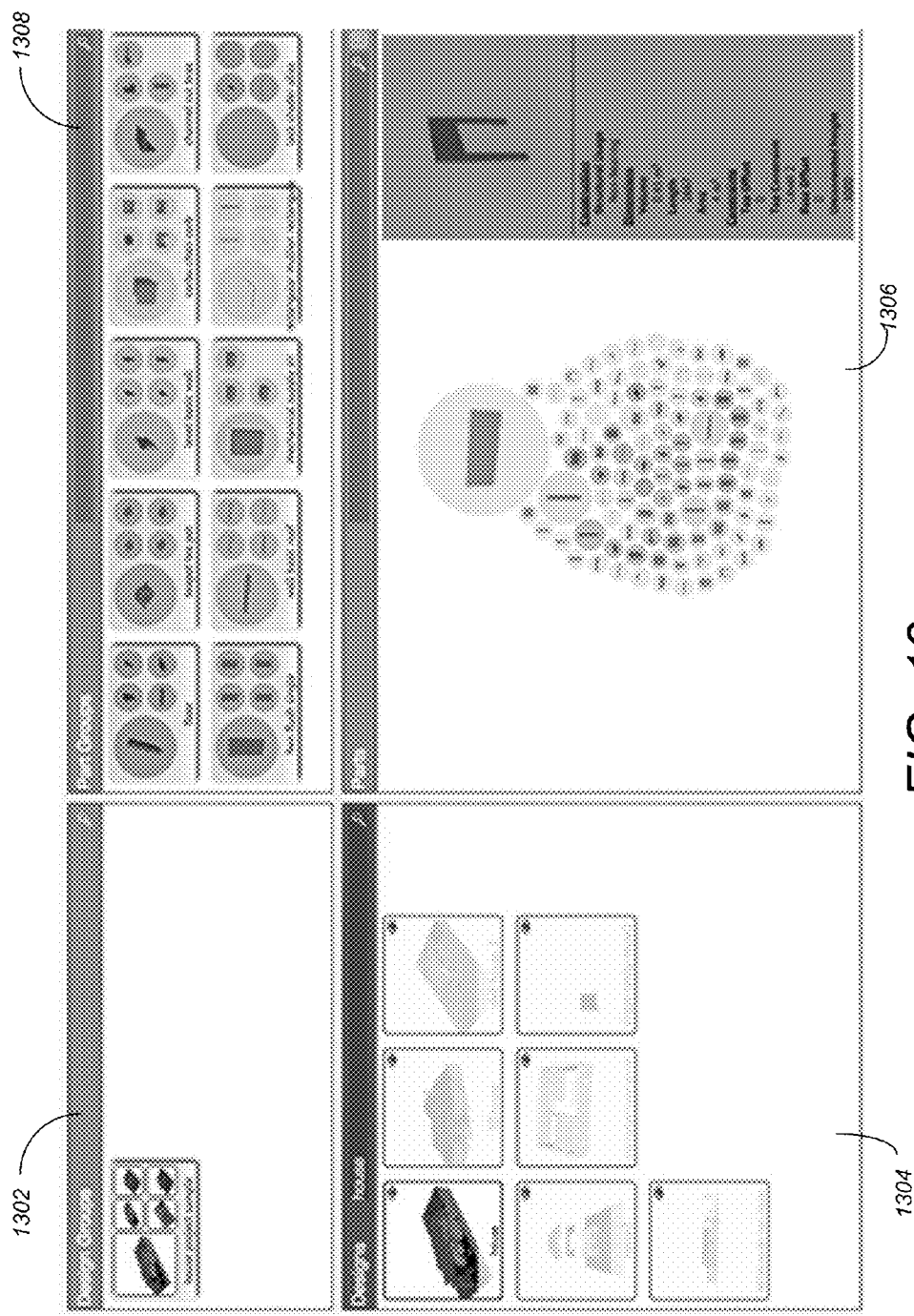
FIG. 13 illustrates the multi-dimension explorer user interface in accordance with one or more embodiments of the invention.

FIG. 13 illustrates the multi-dimension explorer user interface in accordance with one or more embodiments of the invention.

The screen consists of four regions/panels, each representing a different dimension of the design and part data (in counter-clockwise order):

- Design Groups 1302: categories of designs that have been computed (e.g. there might be a category of "residential houses");
- Designs 1304: the designs/models themselves;
- Parts 1306: the parts that are used within the designs and that are classified; and
- Part Groups 1308: the machine learned categories of parts (e.g., based on characteristics or other properties determined per the above-described methods).

Coupled Dimensions

What is interesting in the user-interface of FIG. 13 is that each of these dimensions 1302-1308 are coupled. So that if a particular component 1302-1308 is selected/edited, then the other regions 1302-1308 update (e.g., automatically and dynamically) to show/reflect the selection/edit. For example, if a design group 1302 is selected, the following regions are dynamically updated as a result: the designs 1304 in that class; the parts 1306 used in all those designs 1304; and the categories 1308 of parts 1306 used in all of those designs 1304. A user may then switch to any different region 1304-1308 making that region now the "controlling region". In that case, making changes in the controlling region will now be driving the other regions (e.g., it would be easy to pivot from looking at parts 1306 in a particular design 1304 to looking at all the designs 1304 that are using a particular part 1306). A user may also choose to perform a text search in any region by typing in the search box above the region (indicated by a magnifying glass). In that case, the region is made the controlling region and its contents are populated with the search results (and corresponding regions/panels are also updated accordingly).

Conceptual Association User Interface

In order to facilitate the conceptual associations between parts 1306 and the part groups 1308, a visual correlation may be displayed. For example, parts 1306 may always be represented surrounded by a translucent colored disk (or a disk/geometric shape that is visually distinguishable from other discs/geometric shapes [e.g., intensity, contrast, line type pattern, fill pattern, fill color, etc.]). The visually distinguishable characteristic (e.g., color) of the disk/geometric shape in the part region 1306 has a one-to-one correspondence to the machine learned group (e.g., the part group (category) 1308) that the represented part 1306 belongs too. This usage of shape (disks for parts 1306) and color (categories/groups 1308) helps to reinforce the associations as the user uses this interface. Accordingly, at a glance, users can see a visual correlation between parts in parts panel 1306 and the groups such parts belong to in part groups panel 1308.

Parts Region Functionality

Figure 14:
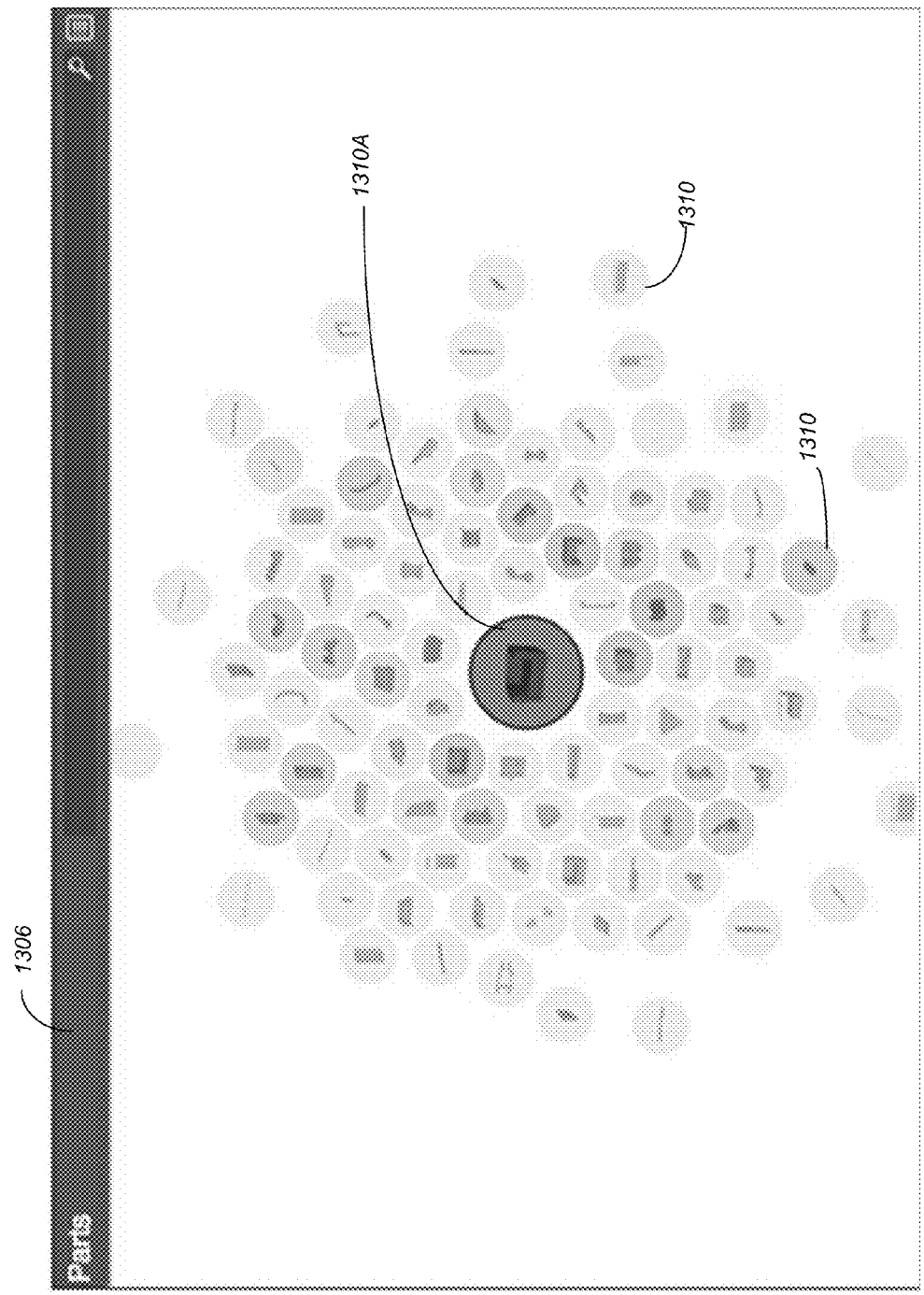
FIG. 14 illustrates a force directed layout of parts in accordance with one or more embodiments of the invention.

The parts region 1306 has particular functionality. FIG. 14 illustrates a magnified view of the parts region 1306 in accordance with one or more embodiments of the invention. In particular, FIG. 14 illustrates a force directed layout of parts in accordance with one or more embodiments of the invention.

When representing the parts that are contained with a design 1304 or a part class/group 1308, the parts 1306 may be represented within disks (as described above). In embodiments of the invention the disks 1310 are sized to represent the relative number of those parts that are actually used. Commonly this is a "bubble chart" in data visualization. However, the use of such disks 1310 and sizing to navigate parts in design information is unique.

In addition, if a user selects (e.g., via double-clicking) any part in the part region 1306, then the region 1306 transforms to show "Similar Parts". In this mode, parts are still represented by disks 1310 but they are arranged in a "force directed layout" that consists of the selected part in the center (e.g., disk 1310A) and other parts displayed at a radial distance from the selected design part (with the radial distance based on similarity to the selected design part). In this regard, parts that are more similar (geometrically) to a selected part are closer (to the selected part) and parts less similar are displayed further away (from the selected part). Using this visual representation (where radial distance represents a measure of "difference") is an innovation. Further, in the force-directed layout mode of FIG. 14, a user can continue to drive the other regions but the selections within the "Part" region 1306 are based on shape similarity.

Part Galaxy Viewer User Interface

Prior art user interfaces fail to provide a notion of serendipitous discovery. Serendipitous discovery refers to discovering other parts that a user didn't even know existed or didn't know he/she was even looking for.

Figure 15A:
FIGS. 15A-15C illustrate a part galaxy viewer user interface in accordance with one or more embodiments of the invention
Figure 15B:
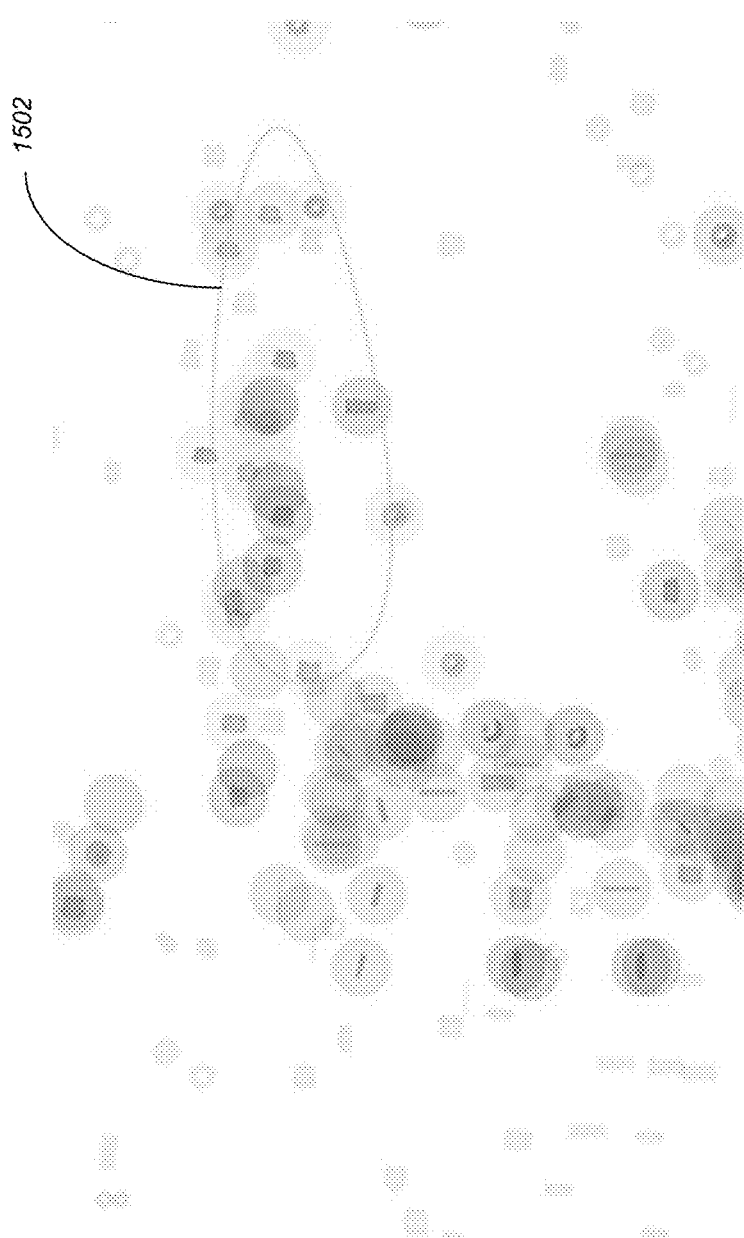
Figure 15C:
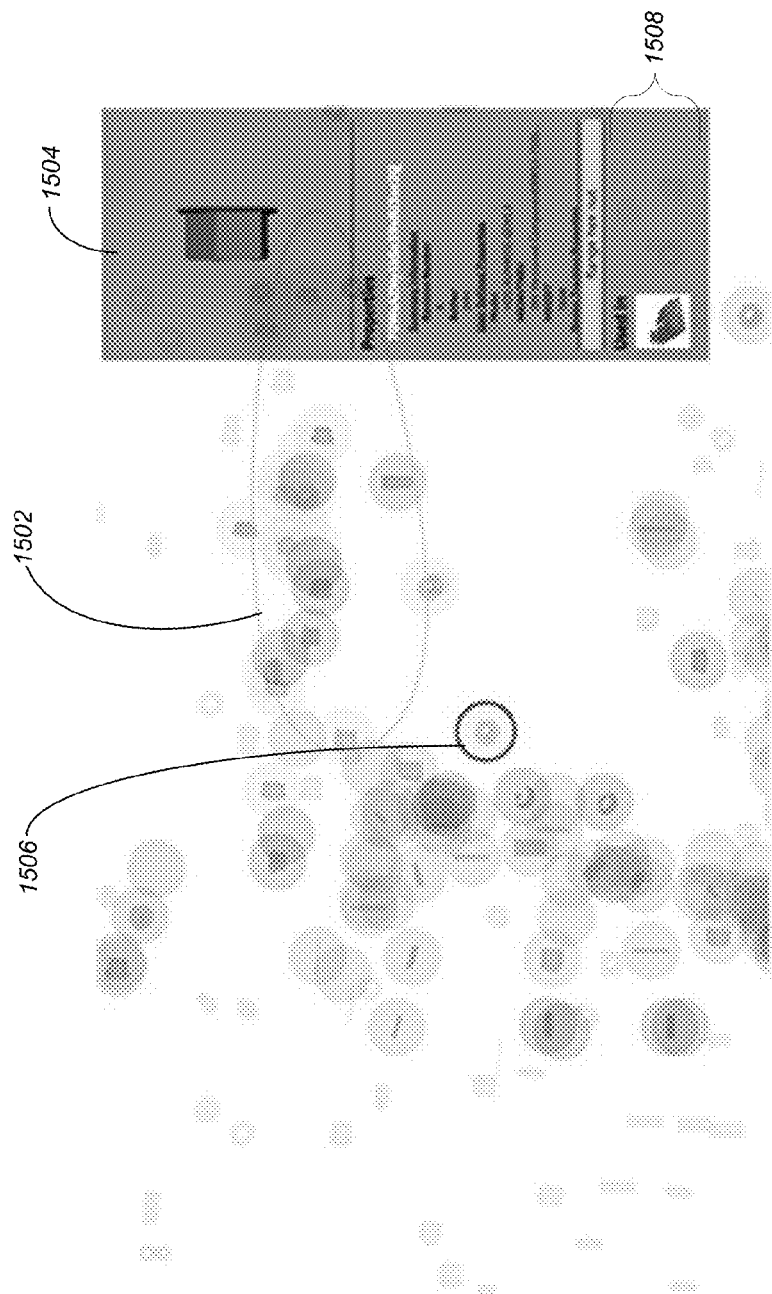

FIGS. 15A-15C illustrate a part galaxy viewer user interface in accordance with one or more embodiments of the invention. This view represents every single part in a user's entire data as a cloud of points where each point represents a particular design part. As in the user interface of FIGS. 13 and 14, each part is represented as a colored disk (colored by category), but the parts are laid out according to a particular organizing principle:

- Parts that are geometrically similar (based on a shape-analysis method that produces a high dimensional feature vector that encodes both the geometric features of the shape as well as its overall structure or topology) are closer together (i.e. obviously neighboring the other parts in the user interface to form a visually recognizable grouping of each particular class of similar parts); and
- Parts that are very different (geometrically) will be apart but the spatial relationship between them may be entirely random.

In other words, a distance between two points in the cloud of points is based on a geometric similarity between the design parts represented by the two points. A "Stochastic Neighbor Embedding" method may be leveraged to perform a specific form of dimensional reduction (into two [2] dimensions) that exhibit the above properties. This organizational lay-out creates a relatively "natural" layout of parts in a display that the user can zoom into/out of and pan about.

FIG. 15A illustrates the initial galaxy viewer user interface in accordance with one or more embodiments of the invention. FIG. 15B illustrates the zoomed-in galaxy viewer user interface in accordance with one or more embodiments of the invention. FIG. 15C illustrates the part selected galaxy viewer user interface in accordance with one or more embodiments of the invention.

Spatial Locality View

As described above, embodiments of the invention provide the ability to navigate all parts in a repository using a "galaxy" view with the semi-random distribution described above. Over time, the distribution begins to create a "spatial locality" for different categories of parts in the user's mind.

Bounding Shape

To further facilitate the ability to find related parts as a user moves over parts (e.g., moves a cursor over one/ multiple parts), embodiments of the invention may dynamically generate and display/draw a "bounding shape" over the entire cluster/collection of parts that that particular part belongs to (e.g., a bounding shape that is indicative of a boundary of a category/design group that the design part belongs to). FIGS. 15B and 15C illustrate such a bounding shape 1502. Such a bounding shape may be any geometric shape (e.g., ovalish) and may be displayed in any color/pattern (e.g., a color/pattern that matches the category of parts that the enclosed parts belong to). Accordingly, FIGS. 15B and 15C show the boundary 1502 of a group of parts. Such a display provides a user with a sense of the extent and overall shape of a local region of parts.

Property Dialog Box Based on Selected Part

Figure 16:
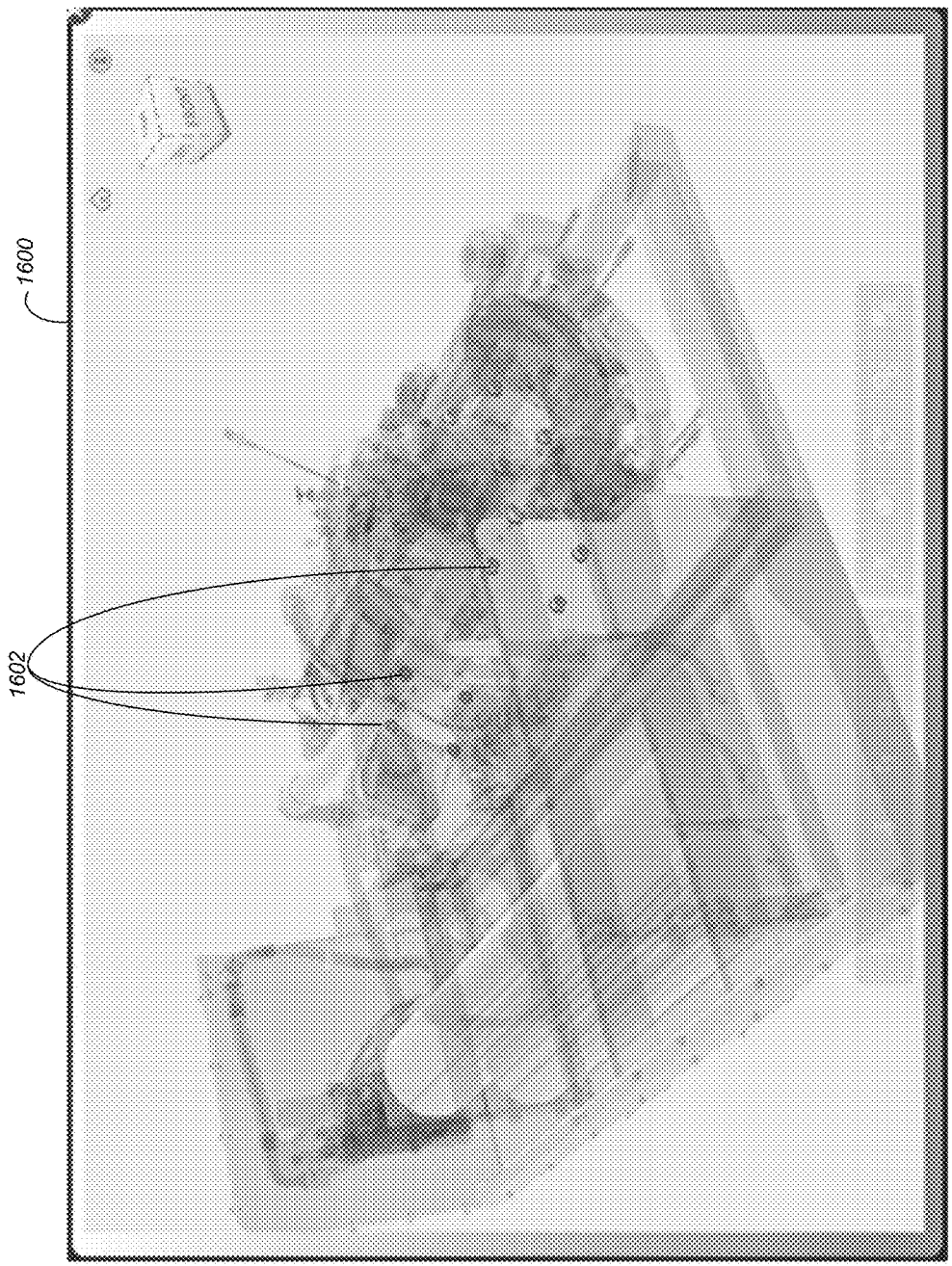
FIG. 16 illustrates an in-context view inside a design itself in accordance with one or more embodiments of the invention.

In FIG. 15C, a dialog 1504 on the right will display the properties of the selected part 1506 including one or more designs 1508 that the part 1506 is used in. By selecting (e.g., via clicking) on one of the designs (e.g., within area 1508), the design itself (3D model) is opened up in the browser/model viewer, and the particular selected part 1506 is isolated to appear different from all other components in the opened design/model. FIG. 16 illustrates an exemplary 3D model view showing various selected parts 1602 displayed in a visually distinguishable manner to differentiate such selected part(s) 1602 from other components in the model. Such a capability allows a user to quickly move from the "galaxy of parts" view (e.g., of FIGS. 15A-C) to an in-context view inside the design itself (e.g., of FIG. 16).

Similar Part Navigation from 3D Model to Design Graph

From within the 3D model view 1600 of FIG. 16, If a user selects a different part in the 3D model and selects a "Design Graph" function on the toolbar, such an action navigates the user back into the "Part Galaxy" of FIGS. 15A-C to highlight the particular part. Such an action then allows the user to explore further parts that are similar to the selected one.

Search Result in Part Galaxy View

To further enable easy finding of parts within the "Part Galaxy," a user may start typing/entering text in which case a search is made against all parts based on the keywords provided.

Figure 17:
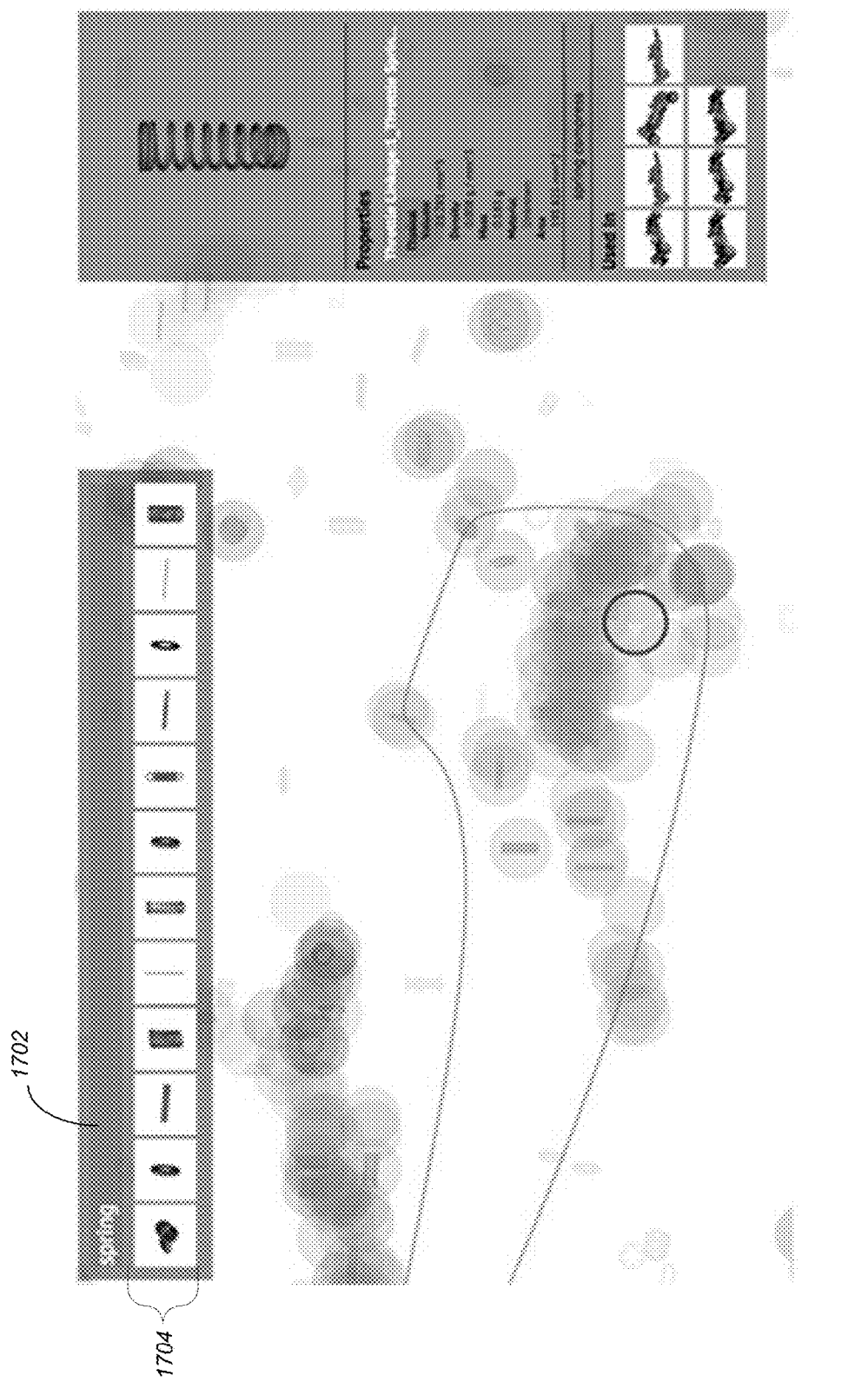
FIG. 17 illustrates a returned list of searched parts displayed in a bar in accordance with one or more embodiments of the invention.

FIG. 17 illustrates an exemplary search result display in the part galaxy view in accordance with one or more embodiments of the invention. The returned list of searched parts may be displayed in a bar/dialog box 1702 (e.g., at the top of the screen). By clicking on a particular result (e.g., one of the icons 1704) the display may be dynamically (e.g., similar to GOOGLE EARTH™ navigation) moved from its current focus to zoom in on the selected part. Such an action provides a quick, search driven, way to navigate and move around parts.

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for defining an attribute of a design part in a manufacturing or construction project, comprising:

obtaining, in a manufacturing or construction project design application, a part set of two or more design parts, wherein each of the two or more design parts comprises metadata;

mining an external corpus to determine a text set of terms relevant to the metadata, wherein the external corpus comprises published information that is external to the manufacturing or construction project design application;

mining, in the manufacturing or construction project design application, the metadata for a pattern based on the text set to discover a metadata property;

defining, in the manufacturing or construction project design application, the attribute based on the metadata property; and searching, via a graphical user interface of the manufacturing or construction project design application, for design parts utilizing a filter based on the metadata property.

2. The computer-implemented method of claim 1, wherein the mining the external corpus comprises utilizing a machine learning technique.

3. The computer-implemented method of claim 2, wherein:

the metadata property comprises a part number;

the external corpus comprises published engineering catalogs;

the text set comprises text syntax of part numbering systems; and the method further comprises:

directly mining the metadata using known part number fields to determine additional text syntax; and adding the additional text syntax to the text set.

4. The computer-implemented method of claim 2, wherein:

the metadata property comprises a material;

the external corpus comprises a catalog of materials, and external text;

the external text comprises synonyms for materials and at least one of adjectives and complements used with specified material terms in the catalog; and the mining the metadata comprises:

searching for a combination of the specified materials terms, synonyms, and adjectives/complements;

determining, based on the searching, that metadata for a design part in the part set matches the combination; and based on the match, assigning associated material from the catalog as the attribute of the matching design part.

5. The computer-implemented method of claim 2, wherein:

the metadata property comprises a manufacturer;

the external corpus comprises web text; and the method further comprises:

building a catalog of manufacturer names based on the mining of the external corpus;

mining the metadata to identify manufacturer fields and adding manufacturer names from the manufacturer fields to the catalog;

searching, based on the catalog, the metadata to identify a matching design part; and assigning a corresponding manufacturer name from the catalog to the matching design part.

6. The computer-implemented method of claim 2, wherein:

the metadata property comprises a mass;

the external corpus comprises an engineering corpus of synonyms and associated terms for mass or weight; and the mining the metadata comprises:

searching for fields having field names that match the synonyms or associated terms;

evaluating units in the matching fields to determine a likelihood that the units represent mass; and based on the likelihood, extracting a mass value, normalizing the mass value, and assigning the normalized mass value to a design part corresponding to the matching fields.

7. The computer-implemented method of claim 2, wherein:

the metadata property comprises a dimension;

the text set comprises a list of common words expressing standard dimension;

the mining the metadata comprises:

using dimension or scale information within a model containing the part if available;

mining all fields in the metadata that are named with the common words;

examining a probabilistic relationship between values in the fields named with the common words and a shape of the model;

based on the probabilistic relationship, determining a linear correlation between dimensions of the shape and the values in the fields; and based on a strength of the linear correlation, assigning the metadata property to one of the dimensions.

8. The computer-implemented method of claim 1, further comprising:

displaying the graphical user interface, wherein the graphical user interface comprises four regions:

a design group region for categories of designs;

a design region for the designs;

a parts region for the design parts that are used within the designs; and a part groups region for one or more machine learned groups of the design parts; and coupling the four regions wherein a selection or an editing of an element in any of the regions catalyzes an automatic dynamic update that reflects the selection or the editing in remaining regions.

9. The computer-implemented method of claim 8, wherein:

in the graphical user interface, the design parts are represented by translucent colored disks; and a color of each translucent colored disk has a one-to-one correspondence to the machine learned group that the represented design part belongs to.

10. The computer-implemented method of claim 9, wherein:

a size of each translucent colored disk represents a relative number of the represented design part.

11. The computer-implemented method of claim 8, further comprising:

selecting a design part in the part region; and based on the selecting, transforming the part region to show similar parts that are arranged in a force directed layout, wherein the force directed layout comprises the selected design part in the center and other design parts displayed at a radial distance from the selected design part, wherein the radial distance is based on similarity to the selected design part.

12. The computer-implemented method of claim 1, further comprising displaying the graphical user interface, wherein:

the graphical user interface comprises a cloud of points;

each point in the cloud of points represents a particular design part; and a distance between two points in the cloud of points is based on a geometric similarity between the design parts represented by the two points.

13. The computer-implemented method of claim 12, further comprising:

moving a cursor over one or more design parts; and in response to the moving, dynamically generating and displaying a bounding shape that is indicative of a boundary of a category that the design part belongs to.

14. The computer-implemented method of claim 12, further comprising:

selecting one of the design parts;

in response to the selecting one of the design parts, displaying a dialog comprising one or more properties of the selected part including one or more designs that use the design part;

selecting one of the designs from the dialog; and in response to the selecting one of the designs, opening up the selected design in a model viewer, wherein the selected part is isolated to appear differently from other components in the opened design.

15. A system for defining an attribute of a design part in a manufacturing or construction project in a computer system comprising:

(a) a computer having a memory;

(b) a manufacturing or construction project design application executing on the computer, wherein the manufacturing or construction project design application is configured to:

(1) obtain a part set of two or more design parts, wherein each of the two or more design parts comprises metadata;

(2) mine an external corpus to determine a text set of terms relevant to the metadata wherein the external corpus comprises published information that is external to the manufacturing or construction project design application;

(3) mine the metadata for a pattern based on the text set to discover a metadata property;

(4) define the attribute based on the metadata property; and (5) search, via a graphical user interface, for design parts utilizing a filter based on the metadata property.

16. The system of claim 15, wherein the mining the external corpus comprises utilizing a machine learning technique.

17. The system of claim 16, wherein:

the metadata property comprises a part number;

the external corpus comprises published engineering catalogs;

the text set comprises text syntax of part numbering systems; and the manufacturing or construction project design application is further configured to:

directly mine the metadata using known part number fields to determine additional text syntax; and add the additional text syntax to the text set.

18. The system of claim 16, wherein:

the metadata property comprises a material;

the external corpus comprises a catalog of materials, and external text;

the external text comprises synonyms for materials and at least one of adjectives and complements used with specified material terms in the catalog; and the manufacturing or construction project design application is configured to mine the metadata by:

searching for a combination of the specified materials terms, synonyms, and adjectives/complements;

determining, based on the searching, that metadata for a design part in the part set matches the combination; and based on the match, assigning associated material from the catalog as the attribute of the matching design part.

19. The system of claim 16, wherein:

the metadata property comprises a manufacturer;

the external corpus comprises web text; and the manufacturing or construction project design application is further configured to:

build a catalog of manufacturer names based on the mining of the external corpus;

mine the metadata to identify manufacturer fields and adding manufacturer names from the manufacturer fields to the catalog;

search, based on the catalog, the metadata to identify a matching design part; and assign a corresponding manufacturer name from the catalog to the matching design part.

20. The system of claim 16, wherein:

the metadata property comprises a mass;

the external corpus comprises an engineering corpus of synonyms and associated terms for mass or weight; and the manufacturing or construction project design application is configured to mine the metadata by:

searching for fields having field names that match the synonyms or associated terms;

evaluating units in the matching fields to determine a likelihood that the units represent mass; and based on the likelihood, extracting a mass value, normalizing the mass value, and assigning the normalized mass value to a design part corresponding to the matching fields.

21. The system of claim 16, wherein:

the metadata property comprises a dimension;

the text set comprises a list of common words expressing standard dimension;

the manufacturing or construction project design application is configured to mine the metadata by:

using dimension or scale information within a model containing the part if available;

mining all fields in the metadata that are named with the common words;

examining a probabilistic relationship between values in the fields named with the common words and a shape of the model;

based on the probabilistic relationship, determining a linear correlation between dimensions of the shape and the values in the fields; and based on a strength of the linear correlation, assigning the metadata property to one of the dimensions.

22. The system of claim 15, wherein the manufacturing or construction project design application is further configured to:

display the graphical user interface, wherein the graphical user interface comprises four regions:

a design group region for categories of designs;

a design region for the designs;

a parts region for the design parts that are used within the designs; and a part groups region for one or more machine learned groups of the design parts; and couple the four regions wherein a selection or an editing of an element in any of the regions catalyzes an automatic dynamic update that reflects the selection or the editing in remaining regions.

23. The system of claim 22, wherein:

in the graphical user interface, the design parts are represented by translucent colored disks; and a color of each translucent colored disk has a one-to-one correspondence to the machine learned group that the represented design part belongs to.

24. The system of claim 23, wherein:

a size of each translucent colored disk represents a relative number of the represented design part.

25. The system of claim 22, wherein the manufacturing or construction project design application is further configured to:

select a design part in the part region; and based on the selection, transform the part region to show similar parts that are arranged in a force directed layout, wherein the force directed layout comprises the selected design part in the center and other design parts displayed at a radial distance from the selected design part, wherein the radial distance is based on similarity to the selected design part.

26. The system of claim 15, wherein the manufacturing or construction project design application is further configured to display the graphical user interface, wherein:

the graphical user interface comprises a cloud of points;

each point in the cloud of points represents a particular design part; and a distance between two points in the cloud of points is based on a geometric similarity between the design parts represented by the two points.

27. The system of claim 26, wherein the manufacturing or construction project design application is further configured to:

move a cursor over one or more design parts; and in response to the move, dynamically generate and display a bounding shape that is indicative of a boundary of a category that the design part belongs to.

28. The system of claim 26, wherein the manufacturing or construction project design application is further configured to:

select one of the design parts;

in response to the selection of one of the design parts, display a dialog comprising one or more properties of the selected part including one or more designs that use the design part;

select one of the designs from the dialog; and in response to the selection of one of the designs, open up the selected design in a model viewer, wherein the selected part is isolated to appear differently from other components in the opened design.

* * * * *

UNITED STATES PATENT AND TRADEMARK OFFICE
CERTIFICATE OF CORRECTION

PATENT NO. : 10,296,626 B2  
APPLICATION NO. : 14/949438  
DATED : May 21, 2019  
INVENTOR(S) : Michael B. Haley et al.

Page 1 of 1

It is certified that error appears in the above-identified patent and that said Letters Patent is hereby corrected as shown below:

On the Title Page

Item (54) and in the Specification, Column 1, Line 1 should read:  
DESIGN GRAPH Signed and Sealed this  
Twentieth Day of August, 2019

Andrei Iancu  
*Director of the United States Patent and Trademark Office*